MONOLITHIC THIN-FILM DEVICES WITH ACTIVE AND RESISTIVE REGIONS

Filed Jan. 3, 1968

INVENTORS.
Cedric G. Currin
Andrew Herczog.
Robert J. Settzo
BY William J. Simmons Jr.
ATTORNEY 3,474,304

MONOLITHIC THIN-FILM DEVICES WITH ACTIVE AND RESISTIVE REGIONS

Cedric G. Currin, Midland, Mich., and Andrew Herczog and Robert J. Settzo, Painted Post, N.Y., assignors to Corning Glass Works, Corning, N.Y., a corporation of New York Filed Jan. 3, 1968, Ser. No. 695,435
Int. Cl. H01l 3/00, 5/00
U.S. Cl. 317—234 12 Claims

ABSTRACT OF THE DISCLOSURE

An integrated circuit including a diode or non-linear circuit element and a resistor both formed by utilizing the same material, a mixture of tin oxide and antimony oxide. These two elements are formed in a single step by depositing on a semiconductor wafer a film of tin oxide and antimony oxide in such a manner that a portion of the film which is to form the diode contacts the semiconductor wafer, and the portion of the film which is to form the resistor is insulated from the semiconductor. To complete the diode an ohmic (metallic) contact is made to the semiconductor wafer near the area at which the film contacts the semiconductor.

Background of the invention

With the present tendency toward microminiaturization of circuitry, a need has arisen for devices which can be formed by thin-film techniques. In the fabrication of integrated thin-film circuits, it is desirable to fabricate various types of components from as few materials and by as few and simple steps as possible.

Electrically conducting oxide coatings which are used in the formation of film resistors usually have no other utility and must be applied to a microcircuit substrate in a step which is separate from those by which active elements are formed. For example, integrated microcircuits such as those disclosed in U.S. Patents No. 3,256,587 issued in the name of James B. Hangstefer and No. 3,138,744 issued in the name of Jack S. Kilby require separate steps in the formation of resistors and active elements. The above described Hangstefer patent teaches the initial steps of diffusing into a semiconductor substrate opposite types of impurities to form diodes therein, thin film resistors being formed on the surface of the substrate in a subsequent process. According to the teachings of the above described Kilby patent, active elements are formed by diffusing impurities into successive layers in the surface of a semiconductor substrate. After doping has been accomplished, upper layers of the substrate other than those required for the active elements are eliminated by etching, resistors being formed over the etched areas by a subsequent process.

Summary of the invention

It is, therefore, an object of this invention to provide an improved method of forming an integrated circuit which overcomes the disadvantages of prior art methods.

Another object of this invention is to provide an improved integrated circuit which is more easily formed than are prior art integrated circuits.

A further object of this invention is to provide an integrated circuit in which both resistors and diodes are formed on a semiconductor wafer by depositing thereon a thin film consisting of a mixture of tin oxide and antimony oxide.

Still another object of this invention is to provide a diode consisting of a mixed film of tin oxide and antimony oxide on a semiconductor substrate.

In accordance with this invention both diodes and resistors are simultaneously formed by depositing on a semiconductor body a single film which contains both tin oxide and antimony oxide.

The formation of thin film resistors from conducting metal oxides is well known. Suitable methods for producing such metal oxide films, and resistors incorporating such films as the conducting element theerof, are described in prior patents. Particular reference is made to U.S. Patents No. 2,564,706 issued in the name of John M. Mochel, No. 2,915,730 issued in the name of James K. Davis and No. 3,217,281 issued in the name of Edward M. Griest et al. In general, the method of film formation involves bringing a suitable mixture of materials in contact with a substrate at a temperature such that the contacting material thermally decomposes to deposit a thin adherent metal oxide film on the substrate. Thin-film microcircuit resistors made in accordance with the teachings of the earlier mentioned Griest et al. patent have received wide acceptance due to their high stability.

It has been discovered that diodes having rectification ratios between $10^5$ and $10^6$ at 3 to 5 volts and a reverse breakdown voltage of about 200 v. can be made by depositing films containing tin oxide and antimony oxide on high resistivity semiconductor substrates. Diodes made from films consisting of both tin oxide and antimony oxide exhibit higher rectification ratios than diodes made from films of either tin oxide or antimony oxide alone. Basically, such diodes consist of a high resistivity semiconductor substrate having a film of metal oxide on one surface thereof, and a low resistance (ohmic) contact applied to both the metal oxide film and the semiconductor substrate.

This invention utilizes the dual capabilities of these oxide films in the fabrication of integrated circuits. Thus, both diodes and resistors can be formed in a single step during which a film comprising a mixture of oxides of tin and antimony is deposited.

The term "diode" is used herein to designate a non-linear circuit element the electrical characteristics of which are similar to those of a p-n junction. This non-linear element consists of a semiconductor-oxide film junction barrier the applications of which include switches, detectors, voltage-controlled capacitors and the like.

Detailed description

Figure 1:
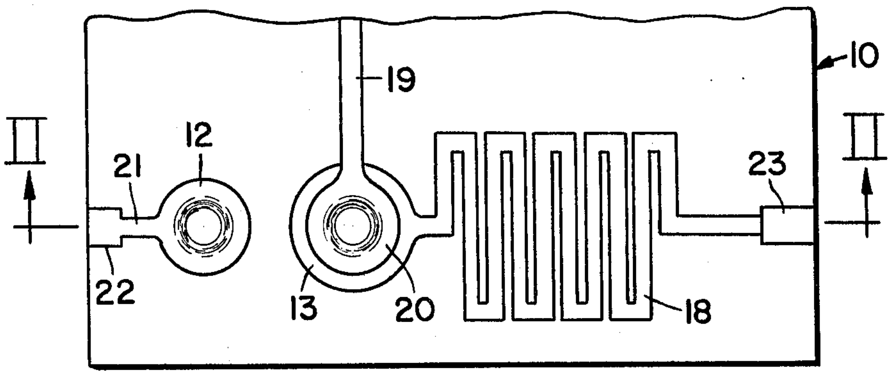
FIG. 1 is a plan view of one illustrative embodiment of the invention.
Figure 2:
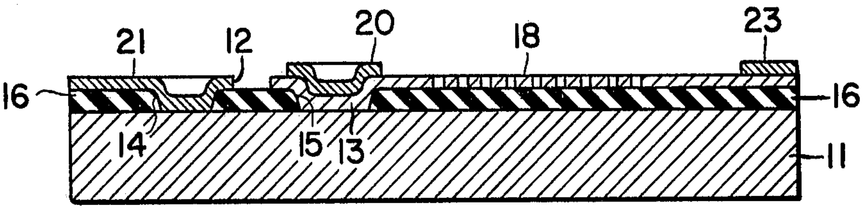
FIG. 2 is a cross-sectional view taken along the sectional lines II—II of FIG. 1.

Referring now to the drawing, and more particularly to FIG. 1, there is shown a portion of an integrated circuit assembly 10 which in the cross-sectional view of FIG. 2 is seen to include a body 11 of semiconductor material. Formed upon the body 11 is a diode which comprises a portion of the body together with the ohmic contact 12 and a portion 13 of an oxide film which are located in a pair of closely spaced windows 14 and 15, respectively, in an insulating layer 16. The portion 13 of the oxide film forms the anode of the diode while the portion of the semiconductor body 11 directly adjacent the portion 13 is the cathode thereof.

The body 11 may consist of either p-type or n-type high resistivity semiconductor material which preferably has a resistivity of at least 20 ohm centimeters for n-type material and at least 100 ohm centimeters for p-type material. These types of material have a bulk carrier concentration not higher than $10^{15}$ atoms per cubic centimeter and preferably have a bulk carrier concentration of about $10^{13}$ atoms per cubic centimeter.

The oxide film is an electrically conducting film which comprises a mixture of tin oxide and antimony oxide. The three-layered film described in the above mentioned Griest et al. patent is preferred since it results in the formation of highly stable resistors as well as good diodes. This three-layered film consists of a middle layer of relatively low conductivity comprising primarily an oxide of tin and about 0.001% to less than 13% of an oxide of antimony ($Sb_2O_3$). The preferred range of $Sb_2O_3$ is between 1% and 10%. The upper and lower oxide films contain about 30% to 60% antimony oxide, the remainder being tin oxide, these films having a much higher resistivity than the middle film. This invention may also be practiced by depositing one or two films of oxide mixtures in accordance with the teachings of the above described Mochel and Davis patents, respectively. The oxide film must be a continuous film the thickness of which is generally about 6000 Angstroms but it can be up to 20,000 Angstroms.

A patterned thin film resistor 18 is located on the insulating layer 16. This resistor and the portion 13 are both part of the same electrically conducting composition. Since the anode of the diode and the resistor 18 consist of the same material, integrated circuits containing diodes and resistors can now be made more simply and economically than has been heretofore possible.

A conductive path 19 which terminates in the terminal portion 20 is provided to connect the junction of the diode and the resistor 18 to other portions of the integrated circuit which are not shown. An interconnecting film 21 of relatively low resistance serves to connect the ohmic contact 12 to an external connection tab 22. An external connection tab 23 is deposited directly on the end portion of the resistor 18.

Figure 3:
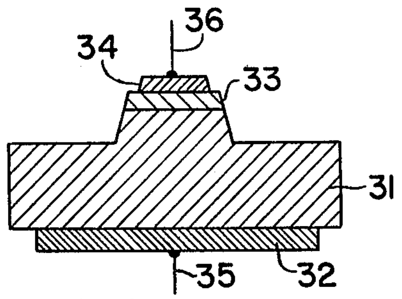
FIG. 3 is a cross sectional view of a discrete diode formed in accordance with this invention.

Although diodes of the composition disclosed herein have more practical application in integrated circuits wherein diodes and resistors can be formed in a single step, the discrete device shown in FIG. 3 can also be made in accordance with this invention. In this figure, a semiconductor body 31 has an ohmic contact 32 applied to one surface thereof and a film 33 of an electrically conducting material deposited on the opposite surface thereof. The film 33 consists of the previously described combination of oxides of tin and antimony. The film 33 is provided with a terminal 34 which consists of a low resistance material such as fired on silver, electroless nickel, copper, or the like. The ohmic contact 32 may consist of gold, aluminum, copper or the like. Two leads 35 and 36 are attached to the ohmic contact 32 and the terminal 34 respectively.

The invention will be further described in the following examples relating to the preparation of the circuit shown in FIGS. 1 and 2.

EXAMPLE 1

A body of n-type silicon was employed having a bulk resistivity of 117 ohm centimeters at room temperature. The insulating layer 16 was provided by thermal oxidation of the silicon wafer 11, a layer of $SiO_2$ about 5,000 Angstroms in thickness being grown.

To form the diode, two closely spaced windows 14 and 15 were etched through the insulating layer 16. In accordance with well known techniques such etching may be accomplished by temporarily coating the insulating layer 16 with a layer of photoresist, exposing the layer of photoresist with light through an appropriate mask, and developing the exposed layer of photoresist. In general, the surface preparation and the photoresist application and development may be carried out in accordance with the recommendations set forth in Kodak Photosensitive Resists for Industry, Kodak Publication No. P–7, 1962, a copy of which may be obtained from Sales Service Division, Eastman Kodak Company, Rochester, N.Y.

The windows 14 and 15 were then etched in the silicon dioxide layer with a 40% HF solution and the photoresist was thereafter removed.

The entire surface of the wafer was then provided with an electrically conductive film consisting of a mixture of oxides of tin and antimony. In order to provide resistors of increased stability, a three-layered film was applied in accordance with the teachings of the above described Griest et al. patent. A solution was made by dissolving one gram of tin chloride in a 1 to 5 mixture of concentrated hydrochloric acid and $H_2O$ to produce 1 ml. of solution. A second solution was made by dissolving one gram of $SbCl_3$ in a 1 to 1 mixture of concentrated hydrochloric acid and $H_2O$ to make 1 ml. of solution. These two solutions were approximately mixed to form the following two solutions: solution A, a hydrochloric acid solution containing 97.5 parts by weight of $SnCl_4 \cdot 5H_2O$ and 2.5 parts by weight $SbCl_3$ and solution B, a hydrochloric acid solution of mixed chlorides containing 40 parts by weight $SnCl_4 \cdot 5H_2O$ and 60 parts by weight $SbCl_3$. Three films were consecutively sprayed on the silicon body in a furnace, the temperature of which was 650° C. Solution B was sprayed onto the body until the first red and/or second blue interference colors were observed. This thickness is achieved in about 6 to 10 seconds of spraying time. The body was then sprayed with solution A for about 4 to 8 seconds (until a sheet resistance of between 400 and 560 ohms is measured). The body was again sprayed with solution B for about 8 seconds.

Part of the electrically conductive oxide film was then removed leaving the anode portion 13 of the diode and the patterned resistor 18. This was accomplished by applying a layer of photoresist to the entire wafer, exposing the layer with the proper light pattern, and developing the photoresist so that the undesired portion of the oxide film was exposed. This exposed portion of the oxide film was removed by subjecting it to an etch consisting of powdered zinc and hydrochloric acid solution.

In accordance with well known techniques, the low resistance paths 19 and 21, and the terminal electrodes 22 and 23 were then deposited. A suitable method for applying these conductive areas is to completely coat the body with a conductive material such as gold, apply a photoresist mask, and remove the metallic layer where not needed, leaving conductive interconnections, resistor terminals, and lead attachments.

EXAMPLE 2

An integrated circuit was fabricated in accordance with the method described in Example 1 except that the electrically conducting oxide film 13, 18 consisted of a single film of oxides of tin and antimony which was applied in the following manner. A solution consisting of 2% anhydrous antimony chloride in anhydrous stanic chloride was prepared. A dry nitrogen carrier gas saturated with the metal chloride solution was caused to react with a forming gas mixture and oxygen at or near the semiconductor body which was heated to about 400° C. The flow rates of the reacting gases were adjusted to an optimum value of about 10 cubic centimeters per minute for the deposition process. The reacting gases were mixed upon exiting from concentric nozzles of a fused silica gun lying one centimeter below the substrate. This arrangement reduced the opportunity for the falling of droplets or particles on the surface of the film which was exposed downward to the gases. The deposition chamber for forming the oxide film consisted of a fused silica bell jar. Inductive heating was employed coupling to a graphite susceptor which rested on top of the substrate. A fused silica cap was used to protect the graphite from chemical attack. Dry nitrogen purging was maintained continuously in the deposition system. An insufficient purging of the deposition chamber would result in a retarded growth rate of the oxide film.

It is to be understood that this invention is not to be limited by the particular methods of depositing the oxide films which are described in Examples 1 and 2, and that other known deposition methods can be used. It is to be further understood that although Examples 1 and 2 describe methods of applying triple and single layers of oxide films, respectively, Example 1 could obviously be used in forming a single layered film and Example 2 could be used to form a three layered film. Separate advantages arise from the methods described in each of the two described examples. Example 1 is a simpler process, but it required a higher temperature than Example 2. Thus, if it were desired to add resistors and diodes to a semiconductor wafer on which active elements were previously formed, the method of Example 2 would be preferred since its lower deposition temperature would not damage the previously formed elements. However, when the higher deposition temperature required in Example 1 is not critical, this method would be preferred.

A detailed electrical analysis of devices fabricated in accordance with Examples 1 and 2 was made by conducting measurements of i–v characteristics, capacitance, temperature and heat treatment effects, diode recovery time and minority carrier life time. From this data the mechanism of rectification was attributed to a Schottky-type barrier or asymmetrically doped p-n junction. The electrical barrier appears to be located partly or entirely within a layer of high carrier concentration between the silicon and the electrically conducting oxide film. This layer was found to be chemically different from both the semiconductor and the deposited oxide film.

Diodes fabricated in accordance with the method described in Example 1 exhibited a rectification ratio of between $10^5$ and $10^6$ to 1. The barrier height was determined to be about 0.5 ev. Diodes fabricated in accordance with Example 2 exhibited rectification ratios between $10^3$ and $10^4$ to 1. It is thus seen that the three-layered electrically conducting oxide film described in Example 2, which has been known in the resistor art as providing extremely stable resistors, also provides diodes having a rectification ratio which exceeds that of the single layered antimony doped tin oxide film of Example 2 by a factor of 100. To provide a basis for comparison of the diodes fabricated in accordance with the present invention with diodes formed by single oxide films, diodes were fabricated by forming mesa diodes from stannic oxide coated silicon wafers. These latter mentioned diodes exhibited rectification ratios between $10^2$ and $10^3$ to 1 and exhibited a built-in potential of about 0.1 ev. Diodes formed by the methods described in Examples 1 and 2 exhibit significantly higher rectification ratios than those formed by depositing pure stannic oxide on high resistivity silicon.

We claim:

1. A semiconductor device comprising
- a body of semiconductor material,
- an insulating layer on one face of said body,
- first and second closely spaced windows in said insulating layer,
- a thin film of an electrically conducting metallic oxide including tin oxide, said film extending into said first window and contacting the portion of said body which is exposed therein, a portion of said oxide film extending in an elongated strip overlying said insulating layer and being contiguous thereto, said elongated strip being proportioned to form a resistor, and
- conductive means in said second window for making an ohmic contact to said semiconductor body.

2. A semiconductor device in accordance with claim 1 wherein said electrically conducting metal oxide film comprises a mixture of tin oxide and antimony oxide.

3. A semiconductor device in accordance with claim 2 wherein said semiconductor body has a carrier concentration not exceeding $10^{15}$ per cubic centimeter.

4. A semiconductor device in accordance with claim 2 wherein said semiconductor body consists of high resistivity silicon.

5. A semiconductor device in accordance with claim 2 wherein said oxide film consists primarily of an oxide of tin, the balance being an oxide of antimony equivalent to about 0.001% to less than 13% $Sb_2O_3$.

6. A semiconductor device in accordance with claim 2 wherein said oxide film comprises a first metal oxide film which consists essentially of from 30% to 60% antimony oxide and the balance tin oxide, and a second metal oxide film disposed on said first metal oxide film, said second film consisting primarily of an oxide of tin and an oxide of antimony equivalent to about 0.001% to less than 13% $Sb_2O_3$.

7. A semiconductor device in accordance with claim 6 additionally having a third metal oxide film superimposed over said second oxide film and consisting essentially of the same composition as said first oxide film.

8. A semiconductor device in accordance with claim 2 which further includes a first layer of conductive material superimposed on the portion of said metallic oxide film which extends into said first window and a second layer of conductive material in contact with the end of said resistor which is remote from said first window, said first and second conductive layers being low resistance terminals.

9. A non-linear circuit element comprising
- a body of semiconductor material having first and second surfaces,
- a thin film of an electrically conducting metal oxide on the first surface of said body, said oxide film being composed of a mixture of tin oxide and antimony oxide, and
- first and second means for making low resistance contact to said oxide film and the second surface of said semiconductor body, respectively.

10. The method of making an electronic device comprising the steps of
- forming an insulating layer upon one face of a wafer of high resistivity semiconductor material,
- removing portions of said insulating layer to provide first and second closely spaced windows therein,
- depositing a first metal oxide film in such a manner that a portion thereof is located in said second window in contact with said wafer, the remaining portion thereof being situated on said insulating layer to form a resistor, said oxide film comprising primarily an oxide of tin, the balance of said oxide film being an oxide of antimony equivalent to about 0.001% to less than 13% $Sb_2O_3$, and
- depositing a layer of conductive material on said insulating layer adjacent said first window, a portion thereof extending into said first window and contacting said wafer.

11. A method in accordance with claim 10 wherein, after the step of removing, the following step is performed
- depositing a second metal oxide film in such a manner that a portion thereof is located in said second window in contact with said wafer, other portions thereof being situated on said insulating layer, said second oxide coating comprising from 30% to 60% antimony oxide and the balance tin oxide, said first metal oxide film being deposited on said second oxide film.

12. A method in accordance with claim 11 wherein, prior to the step of depositing a layer of conductive material on said insulating layer, the following step is performed
- depositing on said first and second oxide films a third oxide film which consists essentially of from 30% to 60% antimony oxide and the balance tin oxide.

(References on following page)

References Cited

UNITED STATES PATENTS 3,367,795 2/1968 Stutzman ---------- 117—212

OTHER REFERENCES

Applied Physics Letters, "A High-Gain In As Thin-

Film Transistor," by Brody and Kunig, October, 1966," vol. 9, No. 7, pp. 259 and 260.

JOHN W. HUCKERT, Primary Examiner

M. EDLOW, Assistant Examiner

U.S. Cl. X.R.

338—308, 309